US008793558B2

(12) United States Patent
Cunningham et al.

(10) Patent No.: US 8,793,558 B2
(45) Date of Patent: Jul. 29, 2014

(54) ADAPTIVE ERROR CORRECTION FOR NON-VOLATILE MEMORIES

(75) Inventors: Jeffrey C. Cunningham, Austin, TX (US); Horacio P. Gasquet, Austin, TX (US); Ross S. Scouller, Austin, TX (US); Marco A. Cabassi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 73 days.

(21) Appl. No.: 13/595,282

(22) Filed: Aug. 27, 2012

(65) Prior Publication Data

US 2014/0059398 A1 Feb. 27, 2014

(51) Int. Cl.
*H03M 13/00* (2006.01)

(52) U.S. Cl.
USPC ........................................ 714/774; 365/185.2

(58) Field of Classification Search
USPC ................................ 714/773, 774; 365/185.2
See application file for complete search history.

(56) References Cited

U.S. PATENT DOCUMENTS

| | | | |
|---|---|---|---|
| 4,791,615 A | 12/1988 | Pelley, III et al. | |
| 5,349,558 A | 9/1994 | Cleveland et al. | |
| 6,301,152 B1 | 10/2001 | Campardo et al. | |
| 6,745,354 B2 | 6/2004 | Terzioglu | |
| 6,909,645 B2 | 6/2005 | Eilert | |
| 7,082,066 B2 | 7/2006 | Yamada | |
| 7,865,797 B2 | 1/2011 | Eguchi et al. | |
| 2007/0201274 A1 | 8/2007 | Yu et al. | |
| 2010/0162084 A1* | 6/2010 | Coulson et al. | 714/773 |
| 2011/0051513 A1 | 3/2011 | Shen et al. | |
| 2012/0163074 A1* | 6/2012 | Franca-Neto et al. | 365/185.2 |
| 2012/0254699 A1* | 10/2012 | Ruby et al. | 714/773 |

FOREIGN PATENT DOCUMENTS

WO    2011024015 A1    3/2011

OTHER PUBLICATIONS

Stapper et al., "Synergistic Fault-Tolerance for Memory Chips", IEEE Transactions on Computers, vol. 41, No. 9, Sep. 1992, 10 pgs.
Chrisanthopoulos et al., "Comparative Study of Different Current Mode Sense Amplifiers in Submicron CMOS Technology", IEEE Proc.-Circuits Devices Syst., vol. 149, No. 3, Jun. 2002, 5 pgs.
Genua, "Error Correction and Error Handling on PowerQuicc III Processors", Freescale Semiconductor Application Note, Document No. AN3532, Nov. 2007, 16 pgs.

* cited by examiner

*Primary Examiner* — Sam Rizk
(74) *Attorney, Agent, or Firm* — Egan, Peterman & Enders LLP

(57) ABSTRACT

Adaptive error correction for non-volatile memories is disclosed that dynamically adjusts sense amplifier read detection windows. Memory control circuitry uses error correction code (ECC) routines to detect bit errors that are non-correctable using these ECC routines. The memory control circuitry then dynamically adjusts sense amplifier read detection windows to allow for correct data to be determined. Corrected data can then be output to external circuitry. The corrected data can also be stored for later access when subsequent read operations attempt to access address locations that previously suffered bit failures. The adaptive error correction can also be used with respect to memories that are not non-volatile memories.

14 Claims, 6 Drawing Sheets

ADAPTIVE ERROR CORRECTION FOR NON-VOLATILE MEMORIES

TECHNICAL FIELD

This technical field relates to non-volatile memories (NVMs) and, more particularly, to techniques for correcting errors in data stored by NVM cells.

BACKGROUND

Programmable memories have been implemented using non-volatile memory (NVM) cells, including split-gate NVM cells. These programmable memories can be implemented as stand-alone memory integrated circuits or can be embedded within other integrated circuits, as desired.

During operation, data stored within NVM cells can include errors. As such, many NVM systems use error correction code (ECC) routines to improve performance. For example, for multi-bit data located at a given address within the NVM system, an ECC routine is applied to the multi-bit data to generate ECC data that is stored within the NVM system along with the multi-bit data. When this multi-bit data is subsequently read from the address location, the ECC routine is performed again to re-generate the ECC data for the multi-bit data. The re-generated ECC data is then compared to the original ECC data to determine if there are single-bit, double-bit, or larger multi-bit errors within the multi-bit data read from the address location, depending upon the ECC routine applied to the multi-bit data. In particular, ECC routines are often employed that can identify, and correct single-bit errors, and that can identify, but not correct, double-bit errors.

As an NVM system is used over-time, the performance of NVM cells can degrade. This degradation in performance can increase the number of bit errors that occur when data is stored within the NVM system and when data is read from the NVM system. For some applications, this increase in bit errors can cause the NVM system to no longer have adequate reliability, thereby limiting the useful life of the NVM system for such applications.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Figure 1:
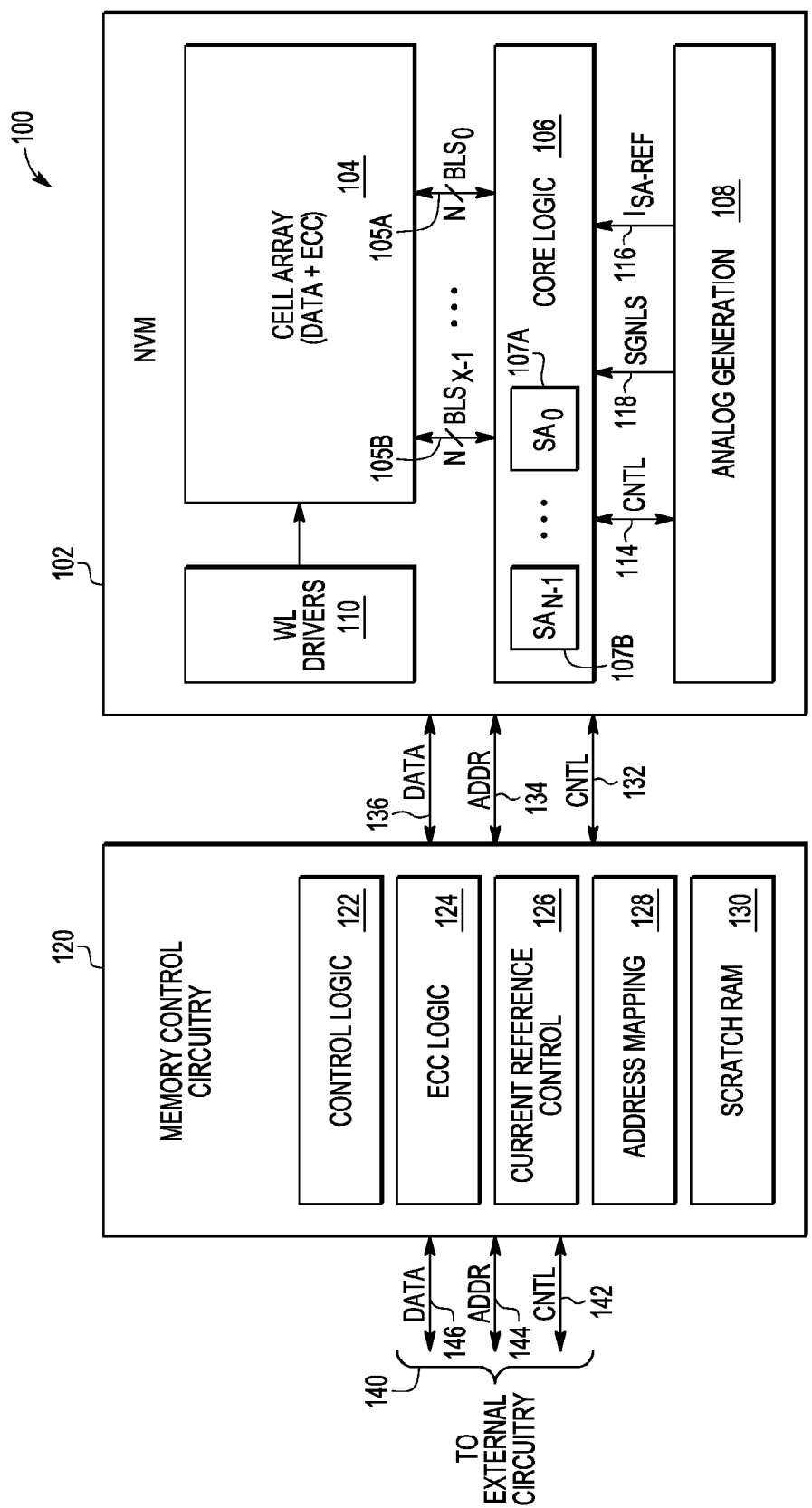
FIG. 1 is a block diagram for a non-volatile memory (NVM) system including ECC logic circuitry that adjusts operating parameters to dynamically vary read detection windows.

Methods and systems are disclosed for adaptive error correction for non-volatile memories that dynamically adjust sense amplifier read detection windows. The methods and systems disclosed use error correction code (ECC) routines to detect bit errors that are non-correctable using these ECC routines. The dynamic adjustments to the sense amplifier read detection windows allow for correct data to be determined. Corrected data can then be output to external circuitry. The corrected data can also be stored for later access when subsequent read operations attempt to access address locations that previously suffered bit failures. The disclosed methods and systems can also be used with respect to memories that are not non-volatile memories. Different features and variations can be implemented, as desired, and related or modified systems and method can be utilized, as well.

As described in more detail below, the disclosed embodiments allow for bit errors that are identifiable but not correctable through ECC routines to be corrected by adjusting operating parameters to thereby adjust the read detection window for the sense amplifier circuitry. The adjusted operating parameters can include, for example, reference currents, voltages, and/or other parameters depending upon the sense amplifier architecture and read detection window adjustments desired. Bit errors can occur due to aging of the NVM cells or from other operating conditions, because a programmed NVM cell is read as an erased cell, and/or because an erased NVM cell is read as a programmed cell. By adjusting the read detection window, the sense amplifier may detect the proper programmed/erased state for the NVM cell, thereby reducing the number of uncorrectable bit errors that may be present in accessed data. For example, if the bit error is reduced from a double-bit error to a single-bit error, an ECC routine that would otherwise not be able to correct a double-bit error can now correct the single-bit error within the accessed data. It is noted that the embodiments disclosed herein can be used with respect to any desired ECC routine where the number of bit errors that can be identified in multi-bit data exceeds the number of bit errors that can be corrected in this multi-bit data. It is further noted that the ECC routines can be based upon Hamming codes, Reed-Solomon codes, BCH (Bose-Chaudhuri-Hocquenghem) codes, Viterbi decoders, and/or other error correction code techniques, as desired. Advantageously, the embodiments described herein extend the usable life of an NVM system by allowing for bit errors to be corrected that would otherwise be uncorrectable.

It is further noted that while the embodiments described below utilize modifications to the sense amplifier reference current as the primary mechanism for adjusting the read detection window, other operating parameters could also be adjusted. For example, the sense amplifier read timing can be modified to adjust the integration time allowed for the accessed NVM cell to cause changes to the bit line voltages. Further, read voltage levels applied to the accessed NVM cell could be adjusted to thereby adjust the read detection window for the sense amplifier circuitry. Other operating parameters could also be adjusted to vary the sense amplifier read detection window, if desired. Still further, once correct data has been detected through adjustments to the read detection window, a variety of additional steps can be taken with this corrected data. For example, the corrected data can be rewritten into the failing address. The corrected data can be stored in memory circuitry and saved for later use. And the parameters associated with adjustments that obtained the corrected data can be stored in memory circuitry and saved for later use. It is further noted that the NVM systems described herein can be a variety of different NVM systems, including FLASH memory systems, systems using floating-gate NVM cells, systems using split-gate NVM cells, and/or other desired NVM systems. Further, charge storage layers within NVM cells can including discrete charge storage layers (e.g., silicon nanocrystals, metal nanoclusters, nitride, etc.), continuous charge storage layers (e.g., polysilicon, etc.), or other charge storage layers, if desired. Still further, while the embodiments described use NVM systems as example memory systems, it is noted that memory systems with other types of memory cells could be utilized, rather than utilizing NVM memory cells, if desired. Other variations could also be implemented while still adjusting read margins dynamically based upon detected, but uncorrectable, ECC failures.

FIG. 1 is a block diagram for an NVM system 100 that includes an NVM 102 and memory control circuitry 120. The NVM 102 includes an array of NVM cells 104, core logic 106, analog signal generation circuitry 108, and wordline driver circuitry (WL DRVRS) 110. The memory control circuitry 120 includes control logic circuitry 122, error correction code (ECC) logic circuitry 124, current reference control circuitry 126, address mapping control circuitry 128, and scratch RAM (random access memory) 130. It is noted that ECC logic circuitry 124 and current reference control circuitry 126 could be combined into a single functional block, if desired. Other variations could also be implemented, as desired. The NVM system 100 and the memory control circuitry 120 communicate control information to each other through control (CNTL) signal lines 132, communicate address information to each other through address (ADDR) signal lines 134, and data information to each other through data (DATA) signal lines 136. The memory control circuitry 120 further communicates to and from external circuitry through control lines 140. For example, control information is communicated through control (CNTL) signal lines 142. Address information is communicated through address (ADDR) signal lines 144. And data information is communicated through data (DATA) signal lines 146. It is noted that the memory control circuitry 120 and the NVM 100 can be integrated within a single integrated circuit, if desired. Further, it is noted that the external circuitry can be additional circuitry that is located within the same integrated circuit or located in a different integrated circuit.

The NVM cell array 104 includes a plurality of NVM cells. In operation, the NVM cells are placed in programmed or erased states that indicate logic values stored by the NVM cells. These logic values represent both data that is stored in the NVM cell array 104 and error correction code (ECC) data associated with ECC routines used by the NVM system 100 to correct errors in the data stored within the NVM cell array 104. The ECC logic 124 receives data to be stored in the NVM cell array 104 and generates the ECC data using ECC routines enabled within the NVM system 100. The ECC data is then stored along with the data within the NVM cell array 104. When the data is subsequently read from the NVM array 104, the ECC data is also read. The ECC logic 124 then re-generates ECC check data based upon the data read from the NVM cell array 104. The ECC check data is then compared against the stored ECC data. If this comparison matches, then the data is deemed correct. If the comparison does not match, the data is deemed to include errors. ECC routines will often detect and correct single-bit errors, and ECC routines will often detect but not correct double-bit errors. More sophisticated and complex ECC routines can detect and correct multiple-bit errors. Further, ECC routines can often detect higher bit errors than they can correct.

The wordline driver circuitry (WL DRVRS) 110 provide wordline voltages to selected rows of NVM cells within the NVM cell array 104. The rows of NVM cells are selected based upon row address information provided by the memory control circuitry 120. If the NVM cells within the array 104 are split-gate NVM cells, the wordline driver circuitry (WL DRVRS) 110 will include both select-gate drivers and control-gate drivers for the NVM cells. The core logic 106 includes circuitry that accesses the selected NVM cells and includes column logic that makes further column selection of data lines from the selected rows of NVM cells. For example, the core logic 106 can include sense amplifier circuitry, timing circuitry, control circuitry and switching circuitry that provides controlled access to data lines from selected rows of NVM cells within the NVM cell array 104. The analog signal generation circuitry 108 is configured to generate and/or provide analog signals that are utilized by the core logic 106. For example, the analog signal generation circuitry 108 can include reference current generators, input/output circuitry, voltage pumps, voltage regulators and voltage reference generators. Control signals are communicated between the core logic 106 and the analog signal generation circuitry 108 using control (CNTL) signal lines 114.

As described in further detail below for certain embodiments described herein, a variable sense amplifier reference current signal ($I_{SA\_REF}$) 116 is generated by the analog signal generation circuitry 108 and provided to sense amplifier circuitry within the core logic 106. Other signals (SGNLS) 118 are also generated by the analog signal generation circuitry 108 and provided to the core logic 106. Further, the core logic 106 includes a plurality of sense amplifiers (SA) that are configured to read an N-bit data word from the cell array 104. For example, a plurality of N sense amplifiers, from a first sense amplifier ($SA_0$) 107A to an Nth sense amplifier ($SA_{N-1}$), are configured to read an N-bit data word from the NVM array 104. Further, one of multiple sets (X) of bit lines can be selected from the cell array 104, for example, using multiplexer circuitry. As depicted, X different sets of bit lines, from a first set of N bit lines 105A ($BLS_0$) to an Xth set of N bit lines 105B ($BLS_{X-1}$), are provided from the NVM array 104 to the core logic circuitry 106. One of these sets of N bit lines 105A ... 105B are then selected for reading by the sense amplifiers 107A ... 107B for a given read operation.

As described above, the ECC logic circuitry 124 applies ECC routines to data being written to the NVM cell array 104 and generates ECC data that is stored along with data written to the NVM cell array 104. During a read operation, the ECC data is compared to re-generated ECC data to determine if data read from the NVM cell array includes bit errors. As further described herein, based upon determinations made by the ECC logic 124, the current reference control circuitry 126 provides control signals to the NVM 102 to control and vary the sense amplifier reference current signal ($I_{SA\_REF}$) 116 applied to the sense amplifier circuitry within the core logic 106. For example, when a double-bit error is detected by the ECC logic circuitry 124, the current reference control circuitry 126 can cause the sense amplifier reference current signal ($I_{SA\_REF}$) 116 to be varied across a selected range of values to determine if correct data can be read from the NVM cell array 104. It is again noted that other operating parameters could also be adjusted, if desired, in addition to or instead of the sense amplifier reference current signal ($I_{SA\_REF}$) 116. For example, a read voltage level for the NVM cells within the array 104 can be generated by the analog generation circuitry 108 and adjusted to vary across a selected range of values to determine if correct data can be read from the NVM cell array 104. This adjustment of the read voltage level, for example, by adjusting wordline voltages applied to the gates of accessed NVM cells, effectively adjusts the read detection window for the sense amplifiers used to detect the voltage levels for the accessed NVM cells. For split-gate NVM cells, control-gate wordline voltages can be adjusted for accessed NVM cells to provide the read voltage level adjustments. Other variations could be implemented as desired.

The control logic circuitry 122 is configured to control operations of the memory control circuitry 120 and the NVM system 102. The address mapping control circuitry 128 receives address information from external circuitry and generates addresses for writing data to and reading data from the NVM cell array 104. The scratch RAM (random access memory) 130 is data storage circuitry accessible by the memory control circuitry 120 to store and retrieve data utilized by the memory control circuitry 120. For example, as described in further detail below, the scratch RAM or data storage circuitry 130 can be used to store corrected data for address locations within the NVM cell array 104 where double-bit errors are detected by the ECC logic 124. Further, the address mapping circuitry 128 can provide address pointers to memory locations within the scratch RAM 130, rather than to memory locations within the NVM cell array 104, in the case that external circuitry provides an address location within the NVM cell array 104 that has previously been corrected. It is noted that other data storage circuitry could also be utilized by the memory control circuitry 120 to store corrected data, address locations, parameter information, and/or any other desired information.

Figure 2:
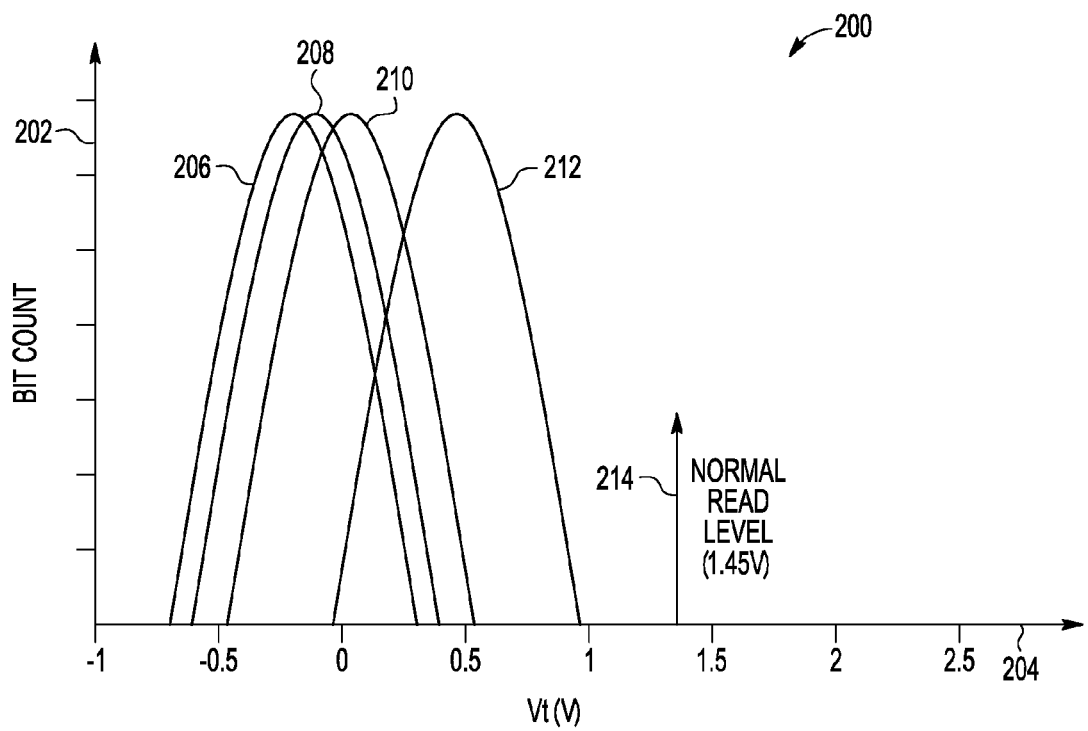
FIG. 2 is a bit histogram showing changes that occur in erase state voltages in the NVM cells as the program/erase cycle count increases.

FIG. 2 is a bit histogram 200 showing changes that occur in erase state voltages stored in NVM cells as the program/erase cycle count increases. The x-axis 204 represents voltage for a threshold voltage (Vt) for the NVM cells in the erase state, and the y-axis 202 represents a number of bits or cells within the NVM array having a particular threshold voltage. The distribution curve 206 represents the threshold voltage distribution for NVM cells within the NVM array when the NVM array is first used in an initial program/erase cycle. The distribution curve 208 represents the threshold voltage distribution for NVM cells within the NVM array after 1000 program/erase cycles. The distribution curve 210 represents the threshold voltage distribution for NVM cells within the NVM array after 10,000 program/erase cycles. And the distribution curve 212 represents the threshold voltage distribution for NVM cells within the NVM array after 100,000 program/erase cycles. Thus, as the NVM array ages, the distribution curves move closer and closer to the voltage level for read operations for the NVM cells. For example, one normal read voltage level is 1.45 volts, as shown by arrow 214. As the distribution curve moves closer to this normal read voltage level 214, bit errors become more and more likely from NVM cells that store erased voltage levels that are close enough to the normal read voltage level to be detected as a programmed cell, rather than an erased cell. Similarly, errors can also occur from programmed voltage levels that move closer to normal read voltage levels as an NVM system degrades. For example, errors can occur for programmed bits with voltage levels above the normal read voltage level that shift lower due to retention loss during high temperature bake.

Advantageously, the embodiments described herein vary operating parameters for the NVM system to thereby adjust the sense amplifier read detection window for detecting data values from NVM cells so as to correct the data read from the NVM array 104. For example, reference currents to the sense amplifier circuitry can be varied across a range of values to determine if double-bit ECC errors can be removed and if so, corrected data is determined and provided as the data read from the NVM array 104. Further, it is again noted that read voltage levels can be varied to adjust the sense amplifier read detection window, and other operating parameters could also be varied to adjust the sense amplifier read detection window, if desired.

Figure 3:
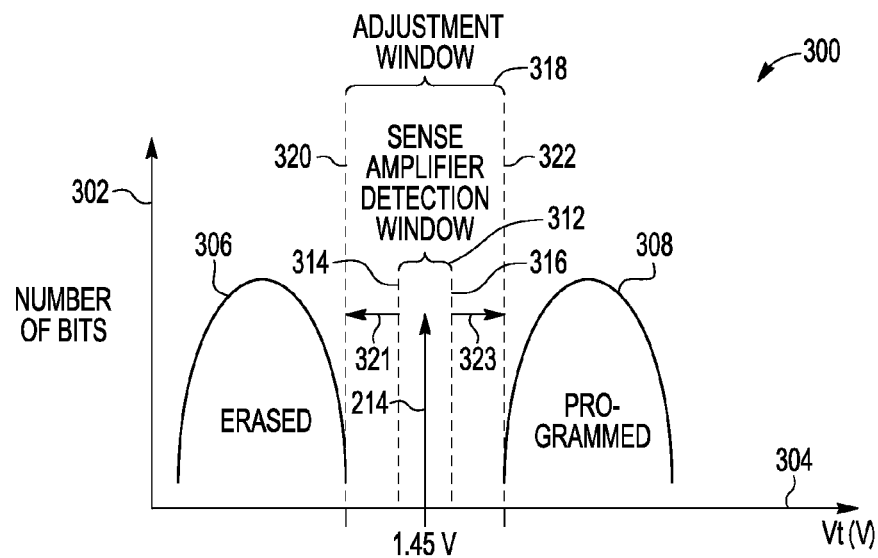
FIG. 3 is a diagram for adjustments to a sense amplifier read detection window.

FIG. 3 is a diagram 300 for detection window adjustments. Similar to FIG. 2, the x-axis 304 represents voltage for a threshold voltage (Vt) for the NVM cells, and the y-axis 302 represents a number of bits or cells within the NVM array having a particular threshold voltage. The distribution curve 306 represents NVM cells that have been erased, and distribution curve 308 represents NVM cells that have been programmed. Arrow 214 represents a nominal read voltage level, and the read voltage represents the bias voltage that is applied to the gate of the NVM cells during read operations and that effectively determines the turn-on threshold voltage for the NVM cell. The dashed lines 314 and 316 represent the edges of a sense amplifier read detection window 312. If an NVM cell voltage level falls within the sense amplifier read detection window 312, the sense amplifier may retrieve incorrect data for the NVM cell. As described herein, the sense amplifier read detection window 312 can be adjusted within an adjustment window 318, as indicated by arrows 321 and 323, between a lower adjustment limit 320 and an upper adjustment limit 322. The adjustment limits 320 and 322 can be selected, as desired, depending upon the operating parameters being adjusted and the range for these adjustments. For example, the adjusted sense amplifier operation parameter can include a sense amplifier reference current, a read voltage level, and/or other operating parameters, as desired.

While erased and programmed NVM cell voltages are designed not to fall within this sense amplifier detection window 312, NVM cell voltages may nevertheless fall within this sense amplifier detection window 312 due to degraded performance of the NVM array. This degraded performance can occur, for example, when elevated voltages are stored for erased cells due to large cycle counts, or when low voltages are stored for programmed cells due to charge loss of data retention. Other conditions can also cause degraded performance where elevated erase voltages and/or reduced program voltages are stored by NVM cells and/or where sense amplifier circuitry reads incorrect data values.

Figure 4:
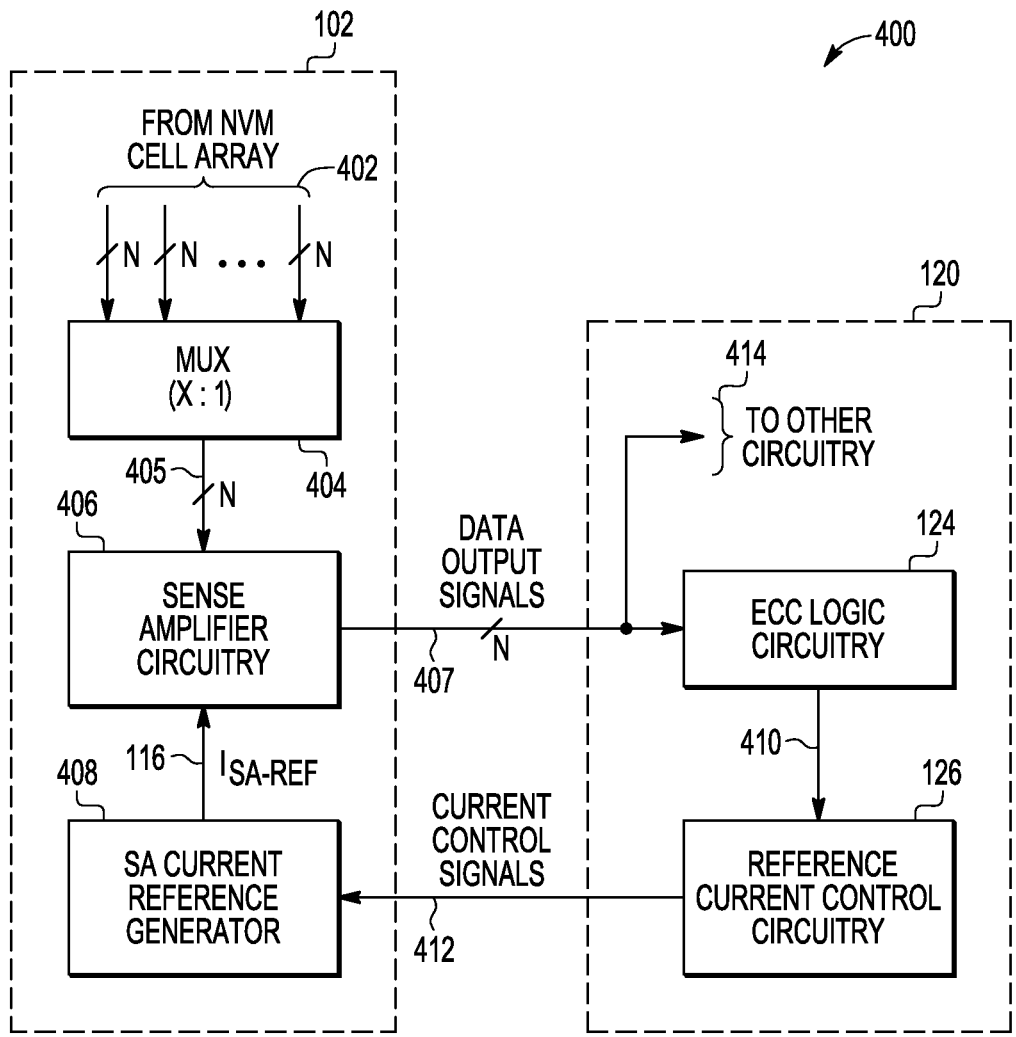
FIG. 4 is a block diagram of an embodiment for varying a sense amplifier reference current to adjust a read detection window.

FIG. 4 is a block diagram of an embodiment 400 that varies a sense amplifier reference current ($I_{SA\_REF}$) 116 to adjust a sense amplifier detection window. A column multiplexer (MUX) 404 receives a plurality (X) of N-bit data paths 402 from the NVM cell array. Each N-bit data path represents data stored within NVM cells within the NVM array 104 and ECC data stored that is associated with this data. The MUX (X:1) 404 then makes a selection of one of these plurality (X) of N-bit data paths to provide as N-bit data path 405 to the sense amplifier circuitry 406. The sense amplifier circuitry 405 then reads the data represented by the N-bit data path 405 by sensing the voltages levels stored within the NVM cells that provide output signals to the selected N-bit data path. After the sensing operation, the sense amplifier circuitry 406 then provides N-bit data output signal 407 to ECC logic circuitry 124 and to other circuitry 414, as desired. The ECC logic circuitry 124 applies ECC routines to the data portion of the N-bit data output signal 407 to re-generate ECC data associated with the stored data. The ECC logic circuitry 124 then compares the re-generated ECC data with the stored ECC data to determine if bit errors exist within the stored data. If a bit error is detected that the ECC logic circuitry 124 cannot correct, then the ECC logic circuitry provides error indication signals 410 to reference current control circuitry 126. Reference current control circuitry 126 then provides current control signals 412 to sense amplifier (SA) current reference generation circuitry to cause the sense amplifier reference current ($I_{SA\_REF}$) 116 to be varied so as to adjust the a sense amplifier detection window 322. The sense amplifier circuitry 406 then re-senses the data levels on the selected N-bit data path 405. This process is repeated until the ECC logic circuitry 124 no longer detects a bit error that cannot be corrected or a determination is made that the read operation has failed, for example, after a selected range of parameter variations has been applied.

It is further noted that for certain embodiments described herein, a single-bit correct and double-bit detect ECC routine is utilized. When a double-bit error occurs during a read operation, the sense amplifier reference current or other operating parameter is modified, and series of re-read operations are done. The modifications are configured to effectively sweep the threshold voltage (Vt) read window until valid data is returned. As described herein, if desired, this correct data can be stored within memory, such as random access memory (RAM), within the NVM system or within other circuitry. When a compromised address is later called for a read operation, a pointer redirects the read from the NVM array to the memory location. Further, if desired, the error correction techniques described herein can potentially be implemented through firmware updates to NVM systems already placed into operation in the field.

Figure 5:
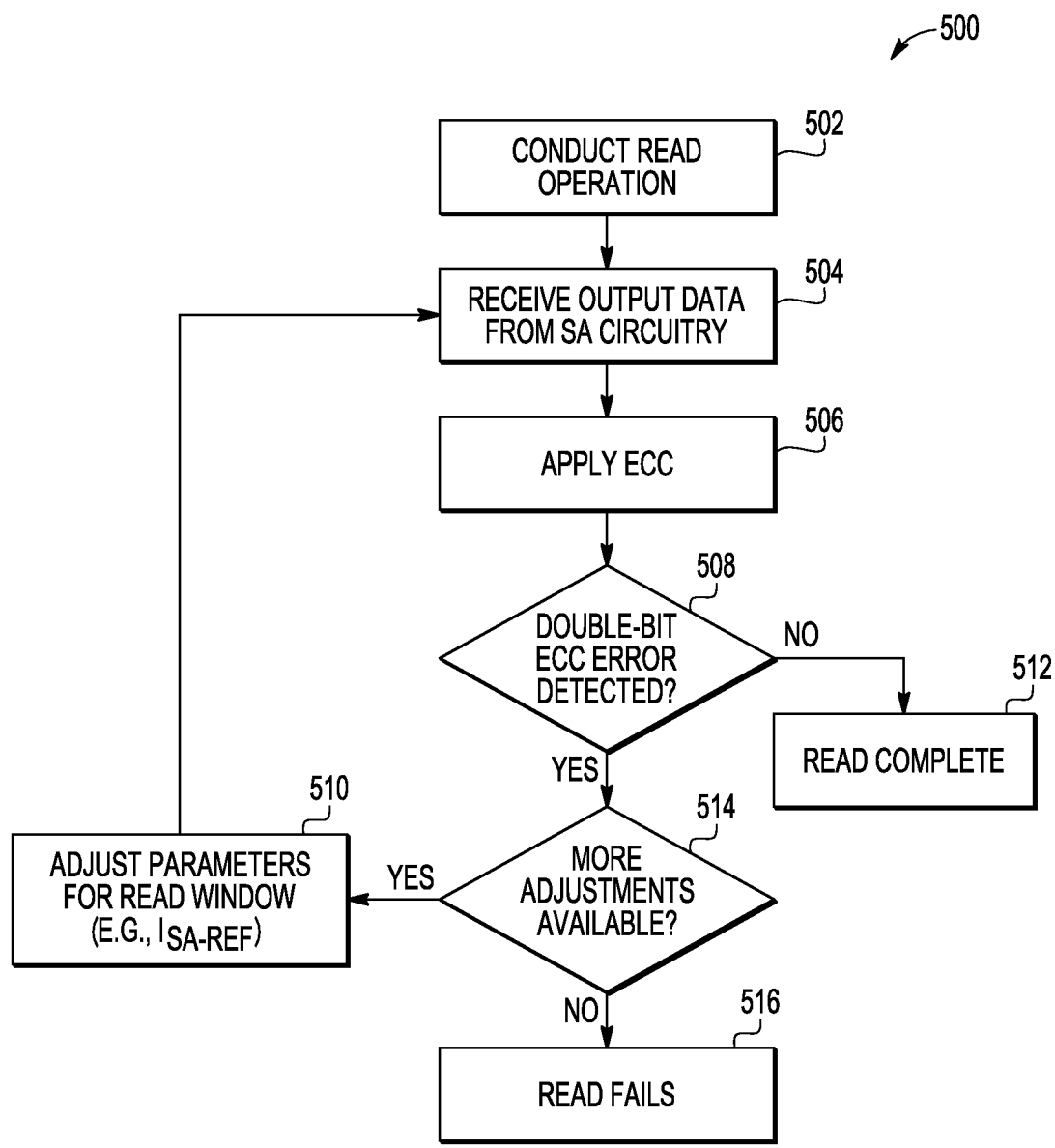
FIG. 5 is a process diagram of an embodiment for varying operating parameters to adjust a sense amplifier read detection window.

FIG. 5 is a process diagram of an embodiment 500 for varying operating parameters to adjust a sense amplifier read detection window. In block 502, a read operation is conducted for the NVM array 104. In block 504, output data is received from the sense amplifier (SA) circuitry. In block 506, ECC routines are applied to the output data from the sense amplifier circuitry. In determination block 508, a determination is made whether or not a double-bit error has been detected. If "NO," then block 512 is reached where the read is complete and data output from sense amplifier circuitry is utilized. If "YES," then determination block 514 is reached where a determination is made whether or not additional read window adjustments are available. If "NO," then block 516 is reached and the read fails. If "YES," then block 510 is reached where at least one operating parameter for the sense amplifier circuitry, such as the sense amplifier reference current ($I_{SA\_REF}$) and/or the NVM cell read voltage level, is adjusted to vary the read window for the sense amplifier circuitry. Flow then passes back to block 502 where the sense amplifier circuitry re-senses the data, and output data is again received from the sense amplifier circuitry. While this example embodiment addresses double-bit errors that are detectable but not correctable by an ECC routine, it is again noted that the embodiments disclosed herein can be used with respect to any desired ECC routine where the number of bit errors that can be identified in multi-bit data exceeds the number of bit errors that can be corrected in this multi-bit data.

Figure 6:
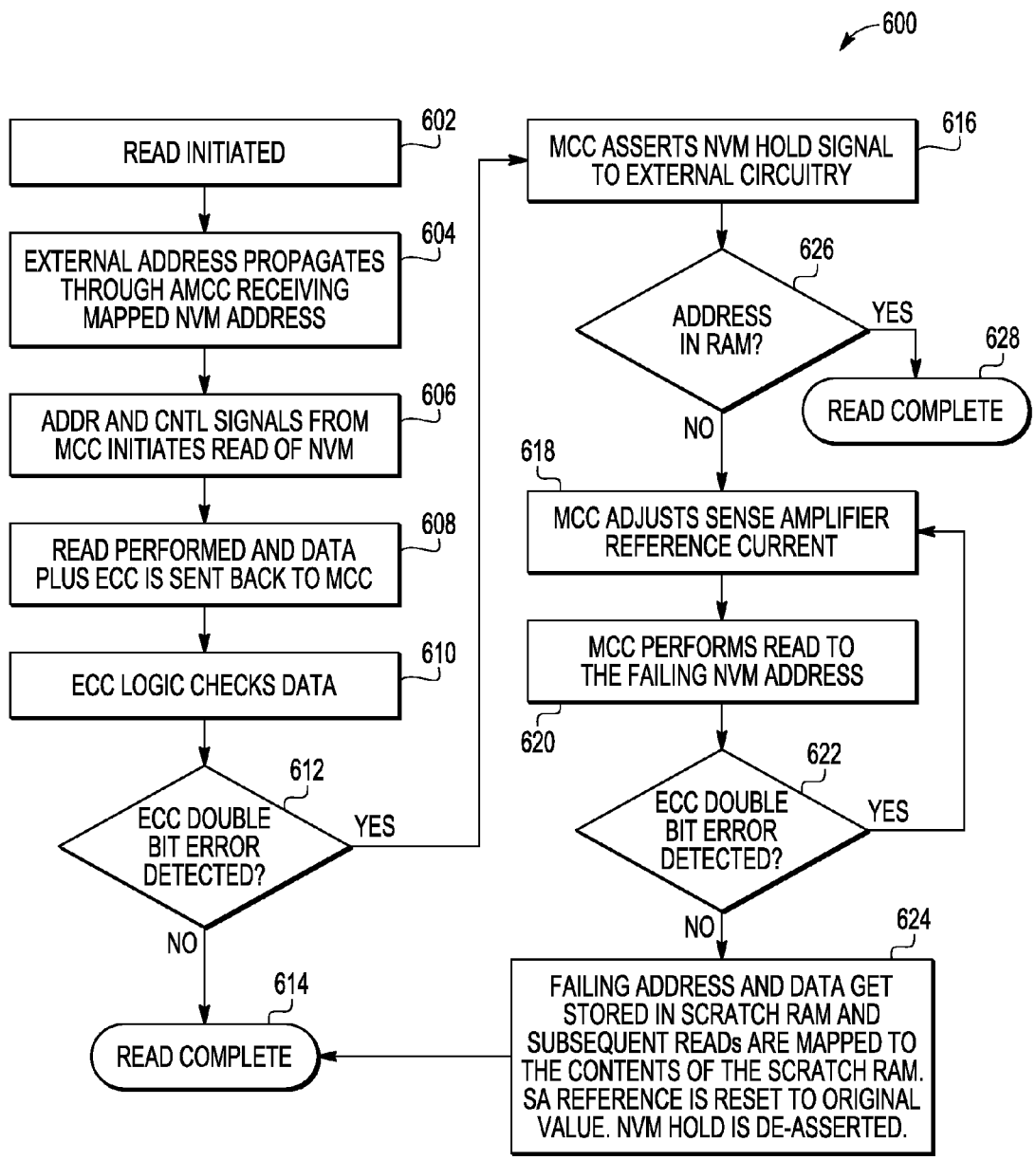
FIG. 6 is a process diagram of an embodiment for varying reference current parameters to adjust a sense amplifier read detection window.

FIG. 6 is a process flow diagram of an embodiment 600 for varying sense amplifier reference current parameters to adjust a read detection window following detection of bit-errors within output data from the NVM array 104. In block 602 a read is initiated for the NVM array 104. In block 604, the external read address propagates through to the address mapping control circuitry (AMCC) 128, which receives the external address. In block 606, the NVM address (ADDR) generated by the address mapping control circuitry (AMCC) 128 and related control (CNTL) signals from the memory control circuitry (MCC) 120 are used to initiate the read of the NVM array 102. Next, in block 608, the NVM array 102 performs the read operation, and associated data and ECC information is sent back to the memory control circuitry (MCC) 120. In block 610, the ECC logic circuitry 124 then checks the accuracy of the data by using ECC routines to re-generate ECC data from the read data and by comparing this new ECC data to the stored ECC data. Next, in determination block 612, a determination is made whether or not an ECC double-bit error has been detected by the ECC logic circuitry 124. If "NO," then flow passes to block 614 where the read operation completes. If "YES," then flow passes to block 616, where error recovery steps begin.

As described herein, the error recovery steps include varying the sense amplifier reference current ($I_{SA\_REF}$) 116 to adjust the read window for the sense amplifier circuitry 406. First, for the embodiment 600 depicted, the memory control circuitry (MCC) 616 asserts an NVM hold command to external circuitry. This hold command informs the external circuitry to hold further read or other commands to the NVM system 100 so as to provide the NVM system 100 time to complete the error recovery process. Next, in determination block 626, a determination is made whether or not the address being read is already stored in the scratch memory (RAM) 130. If "YES," corrected data for this address is already stored in the scratch memory (RAM) 130. This corrected data is used as the output data from the NVM system 100, and the read completes in block 628. If "NO," then flow proceeds to block 618.

In block 618, the memory control circuitry (MCC) 616 adjusts the sense amplifier reference current ($I_{SA\_REF}$) 116. Next, block 620 is reached where the memory control circuitry (MCC) 120 performs a read operation directed to the failing NVM address. In determination block 622, a determination is made whether or not an ECC double-bit error is still detected based upon the data and ECC information that was newly read from the NVM system 102. If "YES," then flow passes back to block 618.

It is noted that a variety of adjustment techniques can be applied with respect to block 618, as desired. For example, the first time block 618 is reached, the memory control circuitry (MCC) 616 can adjust the sense amplifier reference current ($I_{SA\_REF}$) 116 to its lowest limit. Then, each time that step 618 is reached, the memory control circuitry (MCC) 616 can incrementally adjust the sense amplifier reference current ($I_{SA\_REF}$) 116 to a larger current amount. The incremental adjustments can be used to effectively sweep the sense amplifier detection window 312 across a desired adjustment window 318. The size of the increments can be selected, as desired, and variable incremental adjustments could also be used. It is further noted that, if desired, a read failure can be indicated if a maximum current limit is reached before a read operation completes in block 614. It is further noted that other variations and techniques could also be used while still adjusting the sense amplifier reference current ($I_{SA\_REF}$) 116 to effectively adjust the sense amplifier detection window 312. As described herein, this adjustment is being done to determine if correct data can be detected by varying the sense amplifier detection window 312 by adjusting the sense amplifier reference current ($I_{SA\_REF}$) 116.

If the determination in block 622 is "NO," then block 624 is reached, as an ECC double-bit error is no longer being detected. In block 614, the failing NVM address and related data information is stored in the scratch memory (RAM) 130. As such, subsequent reads that reach determination block 626 will be mapped to the contents of the scratch memory (RAM) 130 by the address mapping circuitry 128, rather than to contents of the NVM cell array 104. Further, the sense amplifier reference current ($I_{SA\_REF}$) 116 is reset to its original value. Further, the NVM hold command to the external circuitry is de-asserted so that the external circuitry can continue with additional operations with respect to the NVM system 100. Flow then passes to block 614 where the read operation completes.

Figure 7:
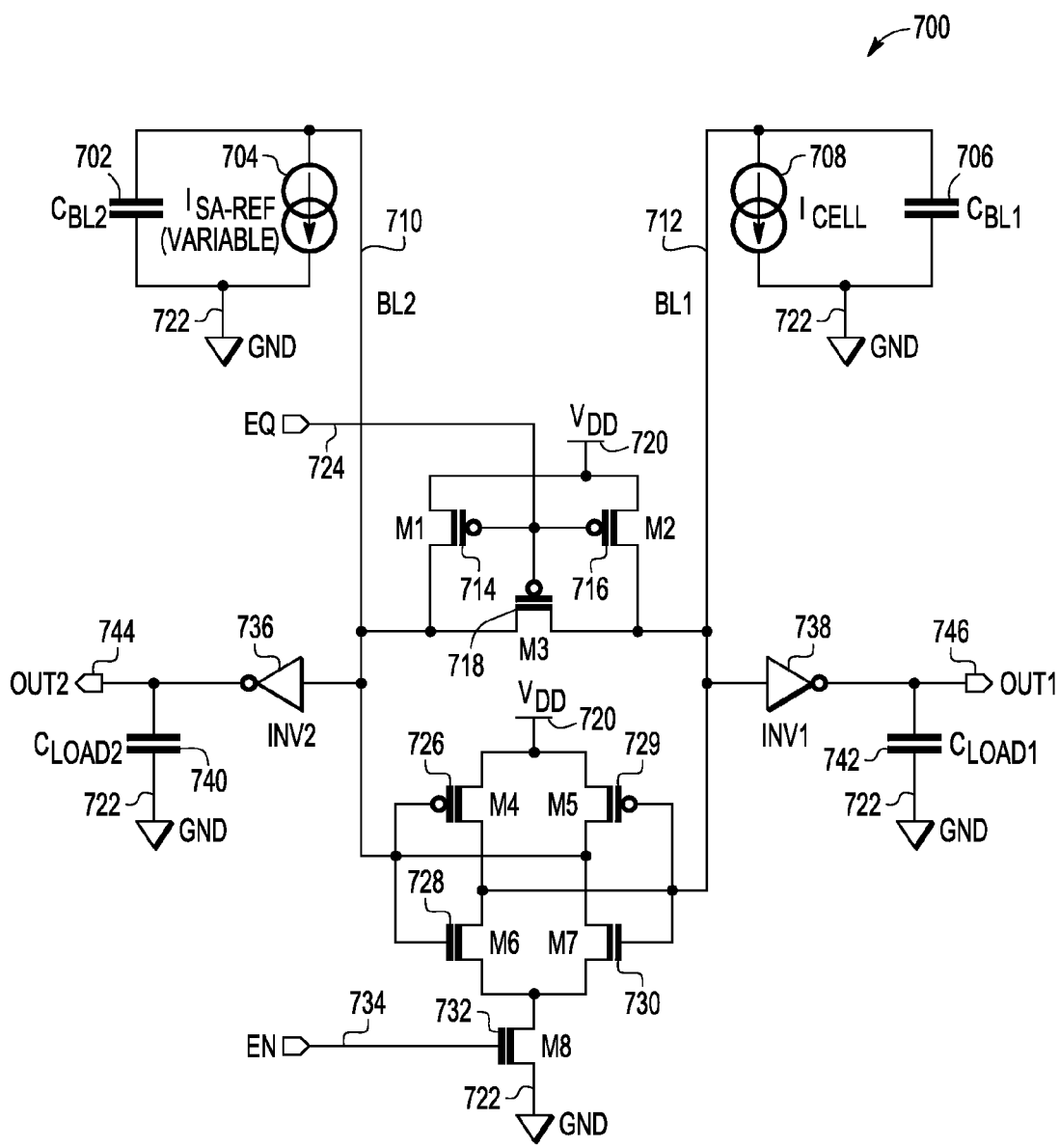
FIG. 7 is a circuit diagram of an embodiment for a sense amplifier.

FIG. 7 is a circuit diagram of an embodiment 700 for a differential sense amplifier that can be utilized for each of the N data paths 405 received by the sense amplifier circuitry 406. For the embodiment 700 depicted, the current generated by the accessed NVM cell is represented by current source ($I_{CELL}$) 708. The capacitor ($C_{BL1}$) 706 represents the bit line capacitance for the first bit line (BL1) 712. As depicted, this current source ($I_{CELL}$) 708 and bit line capacitance ($C_{BL1}$) 706 are coupled in parallel between the first bit line (BL1) and ground (GND) 722. A second bit line (BL2) is also provided for the differential sense amplifier. The capacitor ($C_{BL2}$) 702 represents the bit line capacitance for the second bit line (BL2) 710. The current source ($I_{SA-REF}$(variable)) 704 represents the sense amplifier reference current, which corresponds to the variable sense amplifier reference current ($I_{SA\_REF}$) 116 described above for embodiments that vary the sense amplifier reference current to adjust the read detection window. The first and second bit lines (BL1, BL2) 710 and 712 are connected to a pre-charge circuit that includes transistor (M1) 714, transistor (M2) 716, and transistor (M3) 718. Transistor (M1) 714 and transistor (M2) 716 are connected between supply voltage ($V_{DD}$) 720 and the first and second bit lines (BL1, BL2) 710 and 712, respectively. Transistor (M3) 718 is connected between the first and second bit lines (BL1, BL2) 710 and 712. The gates for transistor (M1) 714, transistor (M2) 716, and transistor (M3) 718 are each coupled to the equalization (EQ) signal 724. When the equalization (EQ) signal 724 is active, the bit lines (B1, B2) 710 and 712 are equalized and pre-charged to the supply voltage ($V_{DD}$) 720.

Transistors (M4, M5, M6, M7) 726, 728, 729, and 730 operate to force the bit lines (BL1, BL2) to opposite voltages depending upon the difference between the current received from the access NVM cell, as represented by current source ($I_{CELL}$) 708, and the reference current a ($I_{SA-REF}$(variable)) 704. In particular, transistor (M4) 726 and transistor (M6) 728 operate as an inverter with its input coupled to the second bit line (BL2) 710 and its output coupled to the first bit line (BL1) 712. Transistor (M5) 729 and transistor (M7) 730 operate as an inverter with its input coupled to the first bit line (BL1) 712 and its output coupled to the second bit line (BL2) 710. As indicated above, the cross-coupled inverters formed by transistors (M4, M5, M6, M7) 726, 728, 729, and 730 operate to force the bit lines (BL1, BL2) to opposite voltages such that one will be pulled up to the supply voltage ($V_{DD}$) 720 and one will be pulled down to ground (GND) 722. Transistor (M8) 732 is coupled between the drains of transistors (M6, M7) 728 and 230 and receives the enable (EN) signal at its gate. When the enable (EN) signal 734 is active, the drains of transistors (M6, M7) 728 and 230 are tied to ground, and the sense amplifier enabled and operating. When the enable (EN) signal 734 is not active, the drains of transistors (M6, M7) 728 and 230 are floating, and the sense amplifier is turned off and not operating.

The sense amplifier 700 provides two output signals based upon the voltages on the bit lines (BL1, BL2) 710 and 712. The first output signal (OUT1) 746 is coupled to the first bit line (BL1) 712 through a first inverter (INV1) 738. The capacitor ($C_{LOAD1}$) 742, which is coupled between the first bit line (BL1) 712 and ground (GND) 722, represents the load capacitance of the output signal path for first output signal (OUT1) 746. The second output (OUT2) 744 is coupled to the second bit line (BL2) 710 through a second inverter (INV2) 736. The capacitor ($C_{LOAD2}$) 740, which is coupled between the second bit line (BL2) 710 and ground (GND) 722, represents the load capacitance of the output signal path for second output signal (OUT2) 744. In operation, as the voltages on bit lines (BL1, BL2) 710 and 712 move high and low, the inverters (INV1, INV2) 736 and 738 will force the voltage signals to the opposite voltage supply polarity, depending upon the threshold switching voltage for these inverters.

It is noted the embodiment 700 represents one sense amplifier implementation that could be used for the sense amplifiers with sense amplifier circuitry 406. Different sense amplifier circuit implementations could also be used, while still taking advantage of the variable sense amplifier read window techniques described herein for addressing ECC double-bit errors. It is also noted that as depicted, transistor (M1) 714, transistor (M2) 716, transistor (M3) 718, transistor (M4) 726, and transistor (M5) 729 are each a PMOS transistor. Further, transistor (M6) 728, transistor (M7) 730, and transistor (M8) 732 are each an NMOS transistor. Variations could be implemented, as desired.

As described herein, a variety of embodiments can be implemented and different features and variations can be implemented, as desired.

In one embodiment, a memory system includes an array of memory cells, sense amplifier circuitry, and memory control circuitry. The sense amplifier circuitry is configured to provide data output signals associated with sensed voltage levels for a plurality of memory cells within the array of memory cells where the sense amplifier circuitry has read detection windows for the sensed voltage levels. The memory control circuitry is configured to receive the data output signals and to identify and correct bit errors within the data output signals by applying at least one error correction control (ECC) routine. The memory circuitry is further configured to vary the read detection windows by adjusting at least one operating parameter when an identified bit error is not correctable by the at least one ECC routine and to cause the sense amplifier circuitry to re-sense voltage levels for the plurality of memory cells using the adjusted at least one operating parameter. In further embodiments, the ECC routine is configured to identify single-bit errors and double-bit errors and is configured to correct only single-bit errors.

In other embodiments, the array of memory cells is an array of non-volatile memory (NVM) cells, and the at least one operating parameter includes a current reference signal for the sense amplifier circuitry. Still further, the memory system can include reference current generation circuitry configured to provide the current reference signal to the sense amplifier circuitry based upon a reference current control signal, and the memory control circuitry is further configured to adjust the reference current control signal when an identified bit error is not correctable. In addition, the memory control circuitry can be configured to adjust the reference current control signal so that the read detection windows are varied across an adjustment window. In additional embodiments, the array of memory cells is an array of non-volatile memory (NVM) cells, and the at least one operating parameter includes a read voltage level applied to the plurality of the memory cells.

In further embodiments, the memory control circuitry is configured to vary the read detection windows until detected but uncorrectable bit errors are corrected and to output corrected data. In addition, the memory control circuitry can be further configured to report a read failure if an adjustment limit has been reached for the at least one operating parameter. In addition, the memory control circuitry can be further configured to store the corrected data in the data storage circuitry. Still further, the memory control circuitry can be configured to access the stored corrected data if a subsequent read operation addresses data from a previously corrected address location within the array of memory cells. In still further embodiments, the memory control circuitry can be further configured to assert a hold command to external circuitry when uncorrectable bit errors are detected and to de-assert the hold command once corrected data is determined.

In another embodiment, a method for reading data from a memory system includes sensing voltage levels for a plurality of memory cells within an array of memory cells using sense amplifier circuitry where the sense amplifier circuitry having read detection windows for the sensed voltage levels, applying an error correction code (ECC) routine to identify and correct bit errors within data output signals associated with sensed voltage levels for the plurality of the memory cells, varying the read detection windows by adjusting at least one operating parameter when an identified bit error is not correctable using the ECC routine, and repeating the sensing, applying, and varying steps until all identified bit errors are correctable using the ECC routine. In further embodiments, the method includes reporting a read failure and ending the repeating step if an adjustment limit has been reached for the at least one operating parameter. Still further, the ECC routine can be configured to identify single-bit errors and double-bit errors and to correct only single-bit errors.

In other embodiments, the array of memory cells includes an array of non-volatile memory (NVM) cells, and the varying step includes varying the read detection windows by adjusting a current reference signal for the sense amplifier circuitry. For still further embodiments, the array of memory cells includes an array of non-volatile memory (NVM) cells, and the varying step comprises varying the read detection windows by adjusting a read voltage level applied to the plurality of memory cells.

In further embodiments, the method includes outputting corrected data. In addition, the method can include storing the corrected data in data storage circuitry. Still further, the method can also include accessing the stored corrected data if a subsequent read operation addresses data from a previously corrected address location within the array of memory cells. In another embodiment, the method includes asserting a hold command to external circuitry when an uncorrectable bit error is detected, and de-asserting the hold command once all identified bit errors are correctable using the ECC routine.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A memory system, comprising:
an array of memory cells;
sense amplifier circuitry configured to provide data output signals associated with sensed voltage levels for a plurality of memory cells within the array of memory cells, the sense amplifier circuitry having read detection windows for the sensed voltage levels; and
memory control circuitry configured to receive the data output signals and to identify and correct bit errors within the data output signals by applying at least one error correction control (ECC) routine, the memory control circuitry being further configured to vary the read detection windows by adjusting at least one operating parameter when an identified bit error is not correctable by the at least one ECC routine and to cause the sense amplifier circuitry to re-sense voltage levels for the plurality of memory cells using the adjusted at least one operating parameter; and
data storage circuitry;
wherein the memory control circuitry is further configured to vary the read detection windows until detected but uncorrectable bit errors are corrected and to output corrected data, to store the corrected data and an address for the not correctable error in the data storage circuitry, and to access the stored corrected data if a subsequent read operation addresses data from the address.

2. The memory system of claim 1, wherein the at least one ECC routine is configured to identify single-bit errors and double-bit errors and is configured to correct only single-bit errors.

3. The memory system of claim 1, wherein the array of memory cells comprises an array of non-volatile memory (NVM) cells, and wherein the at least one operating parameter comprises a current reference signal for the sense amplifier circuitry.

4. The memory system of claim 3, further comprising reference current generation circuitry configured to provide the current reference signal to the sense amplifier circuitry based upon a reference current control signal, and wherein the memory control circuitry is further configured to adjust the reference current control signal when an identified bit error is not correctable.

5. The memory system of claim 4, wherein the memory control circuitry is configured to adjust the reference current control signal so that the read detection windows are varied across an adjustment window.

6. The memory systems of claim 1, wherein the array of memory cells comprises an array of non-volatile memory (NVM) cells, and wherein the at least one operating parameter comprises a read voltage level applied to the plurality of the memory cells.

7. The memory system of claim 1, wherein the memory control circuitry is further configured to report a read failure if an adjustment limit has been reached for the at least one operating parameter.

8. The memory system of claim 1, wherein the memory control circuitry is further configured to assert a hold command to external circuitry when uncorrectable bit errors are detected and to de-assert the hold command once corrected data is determined.

9. A method for reading data from a memory system, comprising:

sensing voltage levels for a plurality of memory cells within an array of memory cells using sense amplifier circuitry, the sense amplifier circuitry having read detection windows for the sensed voltage levels;

applying an error correction code (ECC) routine to identify and correct bit errors within data output signals associated with sensed voltage levels for the plurality of the memory cells;

varying the read detection windows by adjusting at least one operating parameter when an identified bit error is not correctable using the ECC routine and determining an address for the not correctable error; and repeating the sensing, applying, and varying steps until the not correctable error is correctable using the ECC routine;

outputting corrected data;

storing the corrected data and the address in data storage circuitry; and accessing the stored corrected data if a subsequent read operation addresses data from the address.

10. The method of claim 9, further comprising reporting a read failure and ending the repeating step if an adjustment limit has been reached for the at least one operating parameter.

11. The method of claim 9, wherein the ECC routine is configured to identify single-bit errors and double-bit errors and to correct only single-bit errors.

12. The method of claim 9, wherein the array of memory cells comprises an array of non-volatile memory (NVM) cells, and wherein the varying step comprises varying the read detection windows by adjusting a current reference signal for the sense amplifier circuitry.

13. The method of claim 9, wherein the array of memory cells comprises an array of non-volatile memory (NVM) cells, and wherein the varying step comprises varying the read detection windows by adjusting a read voltage level applied to the plurality of memory cells.

14. The method of claim 9, further comprising asserting a hold command to external circuitry when an uncorrectable bit error is detected, and de-asserting the hold command once all identified bit errors are correctable using the ECC routine.

* * * * *